United States Patent [19]

Lee et al.

[11] Patent Number: 5,292,399
[45] Date of Patent: Mar. 8, 1994

[54] PLASMA ETCHING APPARATUS WITH CONDUCTIVE MEANS FOR INHIBITING ARCING

[75] Inventors: Terrance Y. Lee, Oakland; Fred C. Redeker; Petru N. Nitescu, both of Fremont; Robert J. Steger, San Jose; David W. Groechel, Sunnyvale; Semyon Sherstinsky, San Francisco; Maya Shendon, San Carlos; Samuel Luong, San Jose, all of Calif.

[73] Assignee: Applied Materials, Inc., Santa Clara, Calif.

[21] Appl. No.: 819,573

[22] Filed: Jan. 8, 1992

Related U.S. Application Data

[63] Continuation of Ser. No. 513,341, Apr. 19, 1990, abandoned.

[51] Int. Cl.$^5$ ............................................. H01L 21/00
[52] U.S. Cl. ................................. 156/643; 156/646; 156/345
[58] Field of Search .................. 156/345, 643, 646; 204/298.39, 298.34, 298.31; 118/723

[56] References Cited

U.S. PATENT DOCUMENTS

| | | | |
|---|---|---|---|
| 4,350,578 | 9/1982 | Frieser et al. | 204/298.31 X |
| 4,612,432 | 9/1986 | Sharp-Geisler | 156/345 X |
| 4,711,767 | 12/1987 | Diederich | 156/345 X |
| 4,793,975 | 12/1988 | Drage | 156/345 X |
| 4,871,421 | 10/1989 | Ogle et al. | 156/345 X |

FOREIGN PATENT DOCUMENTS

| | | | |
|---|---|---|---|
| 0224423 | 10/1986 | Japan | 156/345 |
| 0047131 | 2/1987 | Japan | 156/345 |

*Primary Examiner*—Thi Dang
*Attorney, Agent, or Firm*—John P. Taylor

[57] ABSTRACT

An improved plasma etching apparatus is disclosed for the plasma etching of semiconductor wafers. The improvement includes conductive means for inhibiting arcing from electrical charges accumulating on one or more non-conductive protective surfaces on members at rf potential within the apparatus, such as the metal pedestal which supports the wafer being etched and supplies the rf potential to it, and the clamping ring mechanism which clamps the wafer to the pedestal. The conductive means may include one or more conductive plugs extending through one or more of the protective surfaces or a conductive ring surrounding the wafer on the top surface of the metal pedestal. The conductive material is selected from the class consisting of carbon; a silicide; titanium nitride; a carbide; and a semiconductor such as silicon doped to provide a resistivity ranging from about 0.001 to about 20 ohm-cm.

33 Claims, 3 Drawing Sheets

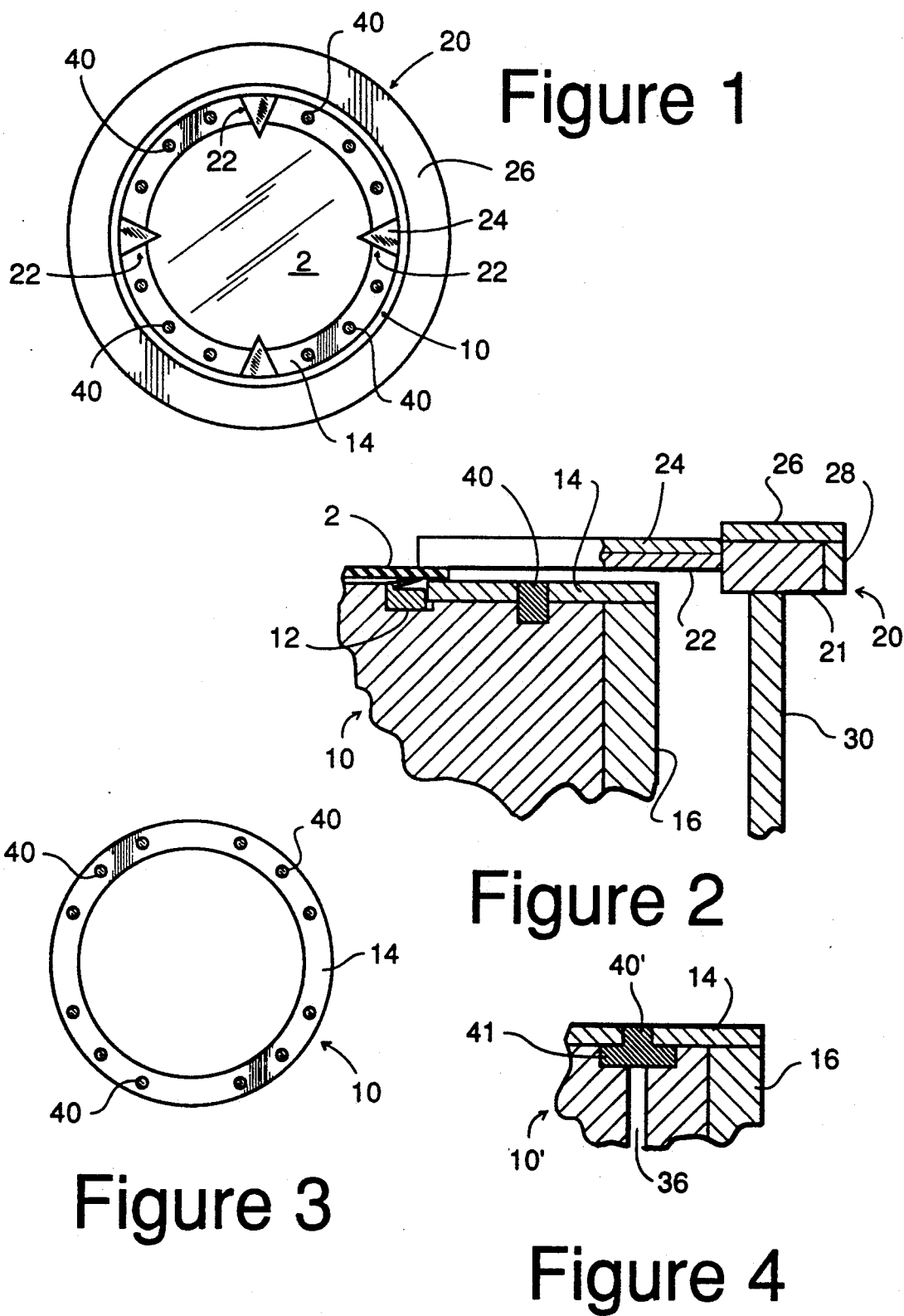

PLASMA ETCHING APPARATUS WITH CONDUCTIVE MEANS FOR INHIBITING ARCING

This is a continuation of copending application Ser. No. 07/513,341 filed Apr. 19, 1990, now abandoned.

BACKGROUND OF THE INVENTION

1. Field of the Invention

This invention relates to vacuum apparatus for plasma etching semiconductor wafers. More particularly, this invention relates to improved plasma etching apparatus having conductive means for inhibiting arcing caused by charge buildup on insulation members adjacent the wafer.

2. Description of the Related Art

Apparatus for plasma etching semiconductor wafers usually comprises a grounded vacuum chamber in which is centrally positioned a cathode pedestal on the top surface of which the semiconductor wafer to be plasma etched is mounted. The wafer is conventionally secured to the pedestal by a clamping ring mounted on its own support means to permit independent vertical travel. The pedestal, and at least sometimes the clamping ring mechanism, are electrically connected to an rf power supply to permit establishment of a plasma between the cathode pedestal and the grounded chamber during the etch.

Both the pedestal and at least portions of the clamping ring mechanism are constructed of metal, usually aluminum metal, both for purposes of strength as well as to provide electrical connection from the rf power supply to the semiconductor wafer mounted thereon. It is, therefore, necessary to protect such metal surfaces on the cathode, as well as metal and/or plastic surfaces on the clamping ring mechanism, to prevent erosion of such metal or plastic surfaces during the etch. This protection is conventionally provided, at least in part to the metal surfaces, by anodizing the metal surfaces not in immediate contact with the wafer. However, anodization alone does not usually provide sufficient protection due to the porous nature of the oxide film formed by anodizing aluminum.

It is, therefore, customary to also cover the metal surfaces (as well as plastic surfaces, for example, on the clamping ring mechanism) directly facing the grounded chamber with insulation material such as quartz which will not be as easily eroded by the etching environment, and which, in any case, may be easily replaced or renewed without replacing the entire pedestal/clamping ring mechanism.

While such practices do serve to protect the metal parts comprising the pedestal and the metal and plastic parts comprising the clamping ring mechanism, the presence of such insulated surfaces immediately adjacent the plasma path between the grounded chamber and the semiconductor wafer can result in charge buildup on the insulation surfaces which, in turn, can result in arcing, which may cause damage to either the wafer and/or the etching apparatus, i.e., the clamping ring mechanism and/or the pedestal.

In particular, the top surface of the pedestal which serves to support the wafer is usually larger in diameter than the wafer, and the exposed peripheral top surface of the pedestal is usually covered with a quartz ring upon which electrical charges may accumulate. Arcing to the cathode of the charges accumulated on such dielectric surfaces is particularly undesirable because of the potential damage to the wafer, as well as to other adjacent parts of the etching apparatus.

It would, therefore, be desirable to provide improved plasma etching apparatus for the etching of semiconductor wafers wherein arcing resulting from such charge buildup is inhibited while still providing protection for the clamping ring mechanism and pedestal which are exposed to the plasma etch.

SUMMARY OF THE INVENTION

It is, therefore, an object of this invention to provide an improved plasma etching apparatus for the plasma etching of semiconductor wafers having means for inhibiting arcing from electrical charge buildup on protective surfaces of members at rf potential within the etching apparatus.

It is another object of this invention to provide an improved plasma etching apparatus for the plasma etching of semiconductor wafers having means for inhibiting arcing from electrical charge buildup on either insulated surfaces on the wafer support pedestal, or on insulated surfaces on the clamping ring mechanism.

It is yet another object of this invention to provide an improved plasma etching apparatus for the plasma etching of semiconductor wafers having low resistance means for inhibiting arcing from electrical charges accumulating on either the insulated surfaces on the wafer support pedestal, or on insulated surfaces on the clamping ring.

It is a further object of this invention to provide an improved plasma etching apparatus for the plasma etching of semiconductor wafers which are provided with conductive means resistant to chemical attack by the plasma etch and capable of inhibiting arcing from electrical charges accumulating on either insulated surfaces on the wafer support pedestal, or on insulated surfaces on the clamping ring mechanism.

These and other objects of the invention will be apparent from the following description and accompanying drawings.

BRIEF DESCRIPTION OF THE DRAWINGS

FIG. 1 is a top view of a pedestal cathode with a wafer centrally mounted thereon and a clamping ring mechanism urging the wafer against the pedestal showing one embodiment of the means for inhibiting arcing from electrical charge buildup of the invention located on the peripheral top surface of the pedestal not covered by the wafer.

FIG. 2 is a fragmentary side section view of the pedestal shown in FIG. 1.

FIG. 3 is a top view of a pedestal cathode with a wafer centrally mounted thereon as in FIG. 1, with the clamping ring mechanism, however, omitted for purposes of better illustrating the means for inhibiting arcing from electrical charge buildup of the invention located on the peripheral top surface of the pedestal not covered by the wafer.

FIG. 4 is a fragmentary side section view of a variation of the embodiment shown in FIGS. 1-3.

DETAILED DESCRIPTION OF THE INVENTION

Figure 5:
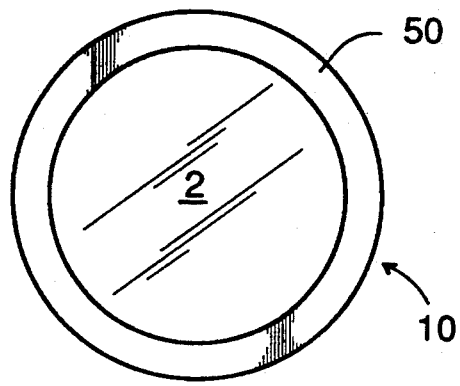
FIG. 5 is a top view of a pedestal cathode with a wafer centrally mounted thereon similar to the view of FIG. 3, but showing another embodiment of the means for inhibiting arcing from electrical charge buildup of the invention located on the peripheral top surface of the pedestal not covered by the wafer.

The invention generally comprises improvements in apparatus used for the rf plasma etching of a semiconductor wafer wherein arcing, resulting from electrical charge buildup on the surfaces of protective insulation material placed over the cathode pedestal on which the wafer is mounted, as well as on the surface of protective insulation material on the clamping ring mechanism used to secure the wafer to the cathode, is inhibited by locating electrically conductive means, preferably capable of resisting erosion from the plasma etch, adjacent such insulated surfaces on the metal cathode and the clamping ring mechanism.

Any conventional rf plasma etching apparatus having protective insulation provided over members maintained at rf potential in the etching chamber may be used in the practice of the present invention. Examples of typical prior art plasma etching apparatus useful in the practice of the present invention include Maydan et al. U.S. Pat. No. 4,668,338 and Cheng et al. U.S. Pat. No. 4,842,683, both assigned to the assignee of this invention, and cross-reference to both of which is hereby made.

Referring now to FIGS. 1-3, a semiconductor wafer 2 is shown mounted on the top surface of a wafer support metal pedestal 10, which is preferably made of aluminum and which serves as a cathode which is electrically connected to an rf power supply (not shown), in an rf plasma vacuum chamber. Wafer 2 is secured to pedestal 10 by a clamping ring mechanism 20 which comprises a clamping ring 21 having a plurality of clamping fingers 22 thereon. Clamping fingers 22 peripherally engage the upper surface of wafer 2 and urge it against the upper surface of pedestal 10, including seal ring 12 which provides a seal around the lower surface of wafer 2 to permit heat conductive gas to be circulated over the back surface of wafer 2 to thermally couple it to pedestal 10, as is well known to those skilled in the art. Clamping ring 20 mechanism is lowered into a clamping position on wafer 2 by vertical support 30 which imparts vertical motion to clamping ring 20.

Surfaces of pedestal 10, clamping ring 21 and clamping fingers 22 directly facing the grounded walls of the plasma etch chamber, which serves as the other electrode connected to the rf power supply, are further protected with electrically non-conductive replaceable cladding materials to prevent or inhibit erosion of the underlying metal and/or plastic materials by the plasma etch. Thus, in the embodiment shown in FIGS. 1-3, a replaceable quartz ring 14 is shown on the periphery of the top surface of pedestal 10, i.e., that portion of the top surface not covered by wafer 10. Plastic clamping ring 21 is similarly protected by quartz member 26 on its upper surface and quartz member 28 on its outer surface, while the top surfaces of plastic clamping fingers 22 are covered with quartz members 24. All of these quartz members may be easily replaced as they erode during the plasma etching, thus avoiding replacement of the more complex and expensive components which they protect.

Quartz insulator members 14, 24, 26, and 28 may range in thickness from about 1/16" to about ¼". Thicker members may be used, but are usually not needed and therefore only contribute to the bulk of the apparatus. Other protective insulating materials, such as $Al_2O_3$ or teflon, may be used instead of quartz, and such materials, when used, may be thinner than 1/16".

While quartz members 14, 24, 26, and 28 provide adequate protection against erosion of the underlying metal and/or plastic surfaces by the action of the plasma etch, the presence of such insulated surfaces immediately adjacent the plasma established between the cathode and the walls of the chamber results in charge buildup on such quartz insulation surfaces. Previous to the present invention, such accumulated charges on the quartz surfaces periodically dissipated as an arc to the nearest conductive surface, which particularly in the case of the charge on quartz surface 14, is usually to a surface of cathode pedestal 10 adjacent wafer 2.

Therefore, in accordance with the invention, means are provided for inhibiting arcing from such electrical charge build-up on at least quartz member 14 on the peripheral upper surface of pedestal 10. In the embodiment shown in FIGS. 1-3, as well as in FIG. 4, such means comprise a series of conductive plugs 40 which pass through quartz member 14 and are shown optionally embedded sufficiently into recesses formed in the top face of pedestal 10 to provide good electrical contact to the pedestal.

Plugs 40 are symmetrically (equidistantly) spaced around quartz ring member 14 as best seen in FIG. 3. However, when positioning clamp ring mechanism 20 on wafer 2, it is preferable that none of the plugs 40 be located directly below clamping fingers 22, as seen in FIG. 2 where the solid (nonsectioned) portion of clamping finger 22 indicates that clamping finger 22 is not positioned directly above the sectioned plug.

While conductive plug 40 is shown and described above as recessed into the upper face of pedestal 10, it should be noted that this is not necessary, as long as good electrical contact is established between conductive plug 40 and pedestal 10.

FIG. 4 illustrates a modification of the embodiment of FIGS. 1-3 wherein a modified plug 40' having an enlarged portion 41 fits into a correspondingly enlarged recess in cathode pedestal 10'. The reason for the enlarged portion 41 on conductive plug is in contemplation of possible erosion of plug 40' prior to its replacement wherein if plug 40' erodes down to the level of cathode pedestal 10', any further erosion will not erode the sidewalls of the recess in pedestal 10', but will merely erode the enlarged portion of plug 40'. A knockout bore 36 is provided in cathode 10' to facilitate the removal of plug 40' should it erode down below the level of pedestal 10'.

Figure 6:
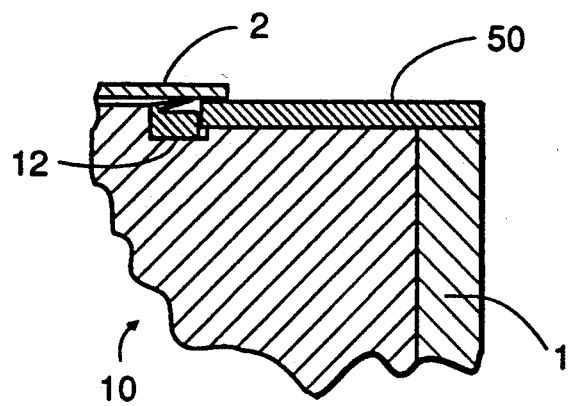
FIG. 6 is a fragmentary side section view of the embodiment shown in FIG. 5.

Turning now to FIGS. 5 and 6, another embodiment of the invention is shown wherein quartz ring member 14 on the peripheral exposed portion of the top surface of pedestal 10 has been replaced, at least in part, with an electrically conductive ring member 50 which may be constructed of the same electrically conductive and chemically nonreactive material as plugs 40. As shown in FIGS. 5 and 6, the entire exposed upper surface of pedestal 10, i.e., all of the peripheral upper surface of pedestal 10 not covered by wafer 2, has been covered by ring member 50.

Figure 5A:
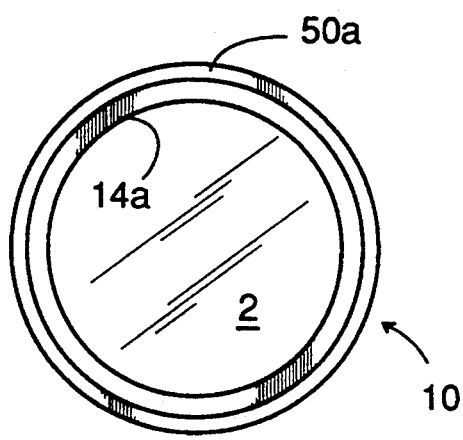
FIG. 5A is a top view of an alternate construction of the embodiment shown in FIGS. 5 and 6.
Figure 5B:
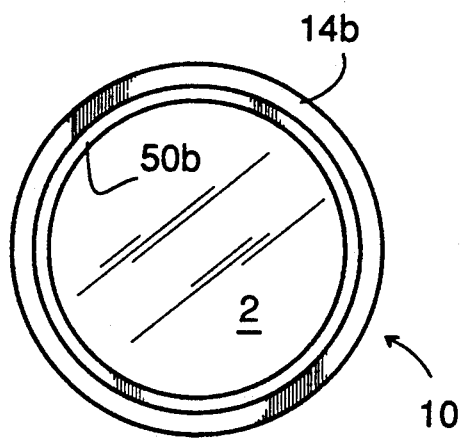
FIG. 5B is a top view of another alternate construction of the embodiment shown in FIGS. 5 and 6.
Figure 5C:
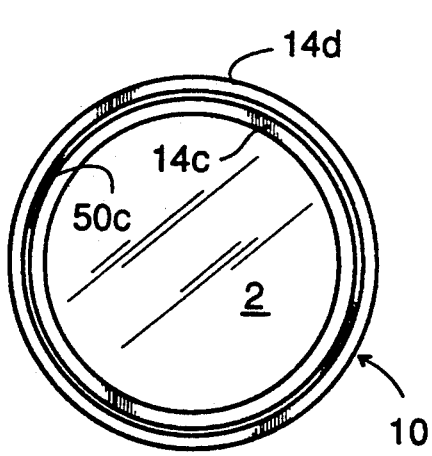
FIG. 5C is a top view of yet another alternate construction of the embodiment shown in FIGS. 5 and 6.

However, it is also within the contemplation of the invention that only a portion of insulation ring 14 be replaced by conductive ring member 50. Thus, for example, the upper exposed peripheral surface of pedestal 10 immediately adjacent wafer 2 could be covered with an insulator ring 14a on the top surface of pedestal 10 with an electrically conductive ring 50a surrounding insulator ring 14a and extending to the outer edge of pedestal 10, as shown in FIG. 5A. Conversely, the upper exposed peripheral surface of pedestal 10 immediately adjacent wafer 2 could be covered with an electrically conductive ring 50b with an insulating ring 14b on the top surface of pedestal 10 surrounding ring 50b and extending to the outer edge of pedestal 10, as shown in FIG. 5B. Finally, as shown in FIG. 5C, a conductive ring 50c may be mounted between an inner insulator ring 14c and an outer insulation ring 14d on the upper surface of pedestal 10 surrounding wafer 2. Multiple conductive rings could also be used and should be deemed to be within the scope of this invention.

It should be noted that although the use of a conductive ring may be preferable over the use of conductive plugs in some instances, in some other circumstances plugs may be preferred over the use of a ring. For example, when silicon is used as the conductive material, and a silicon etch is being carried out where control of the concentration of gaseous silicon etchant is important, the additional area of exposed silicon should be minimized and the use of silicon plugs would be preferred over the use of a silicon ring.

The total cross-sectional area of conductive plugs 40, or ring 50, should be large enough to permit the plugs and/or ring to electrically act, in essence, as a bleeder resistor across the capacitor created by quartz insulator 14 by providing an electrical path for the charge which will thereby inhibit arcing from excessive charge buildup on the insulator surfaces. Preferably, the aggregate or total cross-sectional area of plugs 40 (or ring 50) will be at least about 1 cm$^2$. The maximum size plug diameter of any single plug need not exceed the distance from the wafer to the outer edge of pedestal 10. Furthermore, the exact cross-sectional shape of plug 40 is immaterial.

Conductive plugs 40 and/or ring 50, in a preferred embodiment, are formed from a material which will be relatively inert, i.e. chemically nonreactive, to at least some of the plasma etch processes employed (to prolong the life and avoid constant replacement of such conductive members), yet have a low electrical resistance. However, in the broadest mode, conductive plugs 40 and/or conductive ring 50 may be constructed of any material having an electrical resistivity of less than about 100 ohm-cm.

Examples of materials which may be used in the construction of plugs 40 and/or ring 50 include carbon (graphite); silicides, such as titanium silicide, tungsten silicide, tantalum silicide, and cobalt silicide; titanium nitride; carbides such as silicon carbide, titanium carbide, and tantalum carbide; metals; and semiconductive material such as silicon, germanium, and Group III-V compounds, such as gallium arsenide, gallium phosphide, indium arsenide, and indium phosphide. While metals are included among possible materials from which plugs 40 and ring 50 may be constructed, it should be noted that such usage is not preferred due to contamination which may occur, for example, from sputtering of such metals in the plasma etch chamber during the etching process.

In a preferred embodiment, the electrically conductive material comprises silicon, such as either single crystal silicon or polysilicon, which is doped with one or more Group III-V dopants such as, for example boron, phosphorus, antimony, or arsenic, to provide a resistivity ranging from about 0.001 to about 20 ohm-cm. Usually the polysilicon will be doped to a level ranging from about $10^{14}$ to about $10^{20}$ atoms/cm$^3$ to impart sufficient conductivity to the silicon without, however, resulting in dopant migration from the conductive plugs to the wafer being etched.

Figure 7:
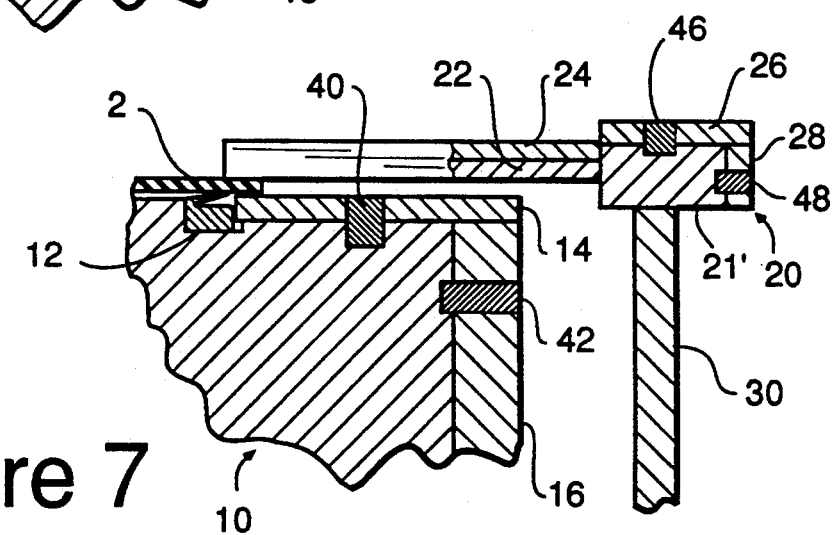
FIG. 7 is a fragmentary side section view of yet another embodiment of the invention.

FIG. 7 shows yet another embodiment of the invention wherein conductive plugs 42, 46, and 48 have also been added to the apparatus to respectively provide further protection from arcing by possible charge accumulation on insulation members 16, 26, and 28. Although these surfaces are not as proximate to the wafer surface as is the top surface of pedestal 10, accumulation of electrical charge on these surfaces is also not desirable and it may, therefore, become necessary to employ the teachings of the invention to one or more of these surfaces as well, and such is deemed to be within the scope of the invention. When using conductive plugs 46 and 48, clamping ring 21' will comprise metal instead of plastic to complete the conductive path from the plasma through conductive plugs 46 and 48 to metal support 30.

In this regard, it should be pointed out that one or more of conductive plugs 42, 46, and/or 48 may be used to inhibit arcing from charge accumulation on insulation surfaces 16, 26, and/or 28 in the plasma etching apparatus in cooperation with the use of either plugs 40 or conductive ring 50 (or either rings 50a, 50b, or 50c) shown in the previous embodiments. It should also be noted that when necessary, insulation surfaces 16, 24, 26, and/or 28 may be entirely replaced by conductive materials such as used for the conductive plugs and/or rings of the invention, as in the case of the replacement of insulation ring 14 by conductive ring 50.

Figure 8:
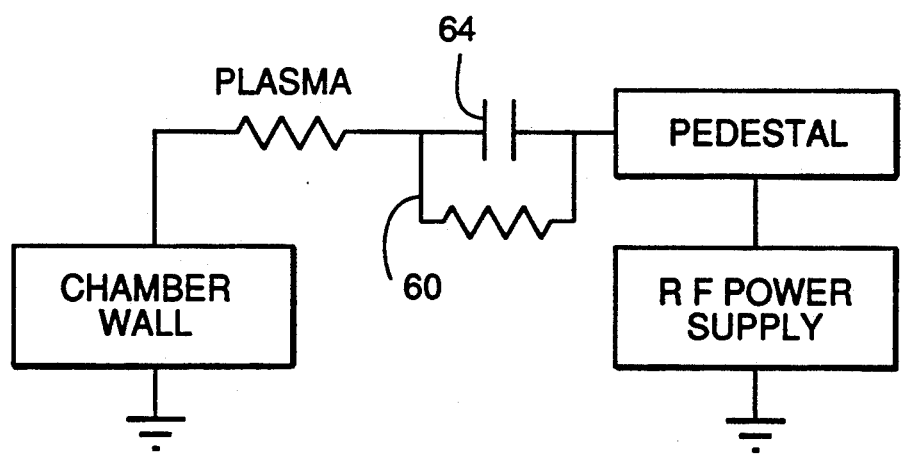
FIG. 8 is an electrical schematic representation of the arc inhibiting means of the invention.

As shown in the simplified electrical schematic illustration of FIG. 8, the one or more electrically conductive members of the invention may be electrically represented as a bleeder resistor 60 in parallel with a capacitor 64 representing the insulated surfaces on which electrical charges accumulate. Since resistor 60 and capacitor 64 are in series with the plasma, the presence of bleeder resistor 60, inhibits arcing resulting from accumulated electrical charges on the insulated surfaces on the cathode pedestal and the clamping ring mechanism represented by capacitor 64.

Thus, the invention provides an improved plasma etching apparatus wherein potential arcing caused by electrical charge accumulation on insulative surfaces on or adjacent the cathode is inhibited by the provision of electrically conductive members adjacent such insulated surfaces.

Having thus described the invention what is claimed is:

1. A method for plasma etching a semiconductor wafer without damaging said wafer by arcing from charge buildup on one or more insulation surfaces adjacent said wafer which comprises etching said wafer in a plasma etching apparatus having a plurality of conductive plug means for inhibiting arcing from electrical charges on said one or more insulation members which are located on metal members at rf potential within said apparatus, said conductive plug means extending through said one or more insulation surfaces to said metal members.

2. A method for plasma etching a semiconductor wafer without damaging said wafer by arcing from charge buildup on one or more insulation surfaces adjacent said wafer which comprises etching said wafer in a plasma etching apparatus containing a metal pedestal having a top surface on which said wafer to be etched is supported; insulation material located on a portion of said top surface of said metal pedestal, at least a portion of which insulation material immediately surrounds and is adjacent to said wafer; and electrical resistance means having an electrical resistivity of less than about 100 ohm-cm for inhibiting arcing from electrical charges on said insulation material, said electrical resistance means located on a top surface of said pedestal spaced from said wafer and surrounding said insulation material which surrounds and is adjacent to said wafer.

3. An improved plasma etching apparatus for the plasma etching of semiconductor wafers to inhibit arcing from electrical charge buildup on one or more protective insulator surfaces on members at rf potential within said apparatus comprising:
 a) a metal pedestal having a top surface on which said wafer to be etched is supported;
 b) insulation material located on a portion of said top surface of said metal pedestal comprising a first portion immediately surrounding and adjacent said wafer;
 c) low electrical resistance means surrounded by at least a portion of said insulation material and extending from a top surface of said insulation material through said insulation material to said top surface of said pedestal;
whereby arcing from electrical charge buildup on said surface of said insulation material within said apparatus is inhibited.

4. The improved plasma etching apparatus of claim 3 wherein said low electrical resistance means comprise a conductive material selected from the class consisting of carbon; a silicide; titanium nitride; a carbide; and a semiconductor.

5. The improved plasma etching apparatus of claim 4 wherein said conductive material comprises one or more plug members extending from said top surface of said insulation material on said metal pedestal through said insulation material to at least said top surface of said metal pedestal beneath said insulation material.

6. The improved plasma etching apparatus of claim 5 wherein said one or more conductive plug members extend down into recesses formed in said top surface of said metal pedestal.

7. The improved plasma etching apparatus of claim 6 wherein said one or more conductive plug members each has an enlarged portion which extends down into a recess formed in said top surface of said metal pedestal.

8. The improved plasma etching apparatus of claim 5 wherein said metal pedestal has a side surface covered with an insulation member and said one or more plug members constructed of said conductive material extends from an outer surface of said insulation member on said side surface of said metal pedestal through said insulation member to said metal pedestal side surface.

9. The improved plasma etching apparatus of claim 4 wherein said low electrical resistance means comprise silicon.

10. The improved plasma etching apparatus of claim 9 wherein said silicon is doped to provide a resistivity ranging from about 0.001 to about 20 ohm-cm.

11. The improved plasma etching apparatus of claim 9 wherein said silicon is doped with one or more dopants selected from the class consisting of boron, phosphorus, antimony, and arsenic.

12. The improved plasma etching apparatus of claim 4 wherein said low electrical resistance means comprise a conductive material resistant to chemical attack by the plasma etching carried out in said apparatus.

13. The improved plasma etching apparatus of claim 4 wherein said conductive material comprises a ring on at least a portion of said top surface of said metal pedestal surrounding an inner ring of insulation on said top surface of said pedestal which inner ring of insulation surrounds said wafer mounted on said metal pedestal.

14. The improved plasma etching apparatus of claim 3 wherein said low electrical resistance means comprise a plurality of metal plugs symmetrically spaced apart in said insulation material.

15. An improved plasma etching apparatus for the plasma etching of semiconductor wafers wherein the improvement comprises a plurality of conductive plug means for inhibiting arcing from electrical charges on one or more protective insulation members which are located on metal members at rf potential within said apparatus, said conductive plug means extending through said one or more insulation members to said metal members.

16. The apparatus of claim 15 wherein said conductive plug means comprises one or more silicon plug members extending from a top surface of an insulation member which is located on a metal pedestal on which said wafer to be etched is mounted through said insulation member to at least a top surface of said metal pedestal beneath said insulation member.

17. The improvement of claim 16 wherein said one or more silicon plug members are doped with from about $10^{14}$ to about $10^{20}$ atoms/cm$^3$ of one or more dopants selected from the class consisting of boron, phosphorus, antimony, and arsenic.

18. The improved plasma etching apparatus of claim 15 wherein said plurality of conductive plug means comprises conductive plug members extending from a top surface of an insulation member which surrounds said wafer and is located on a metal pedestal on which said wafer to be etched is mounted through said insulation member to at least a top surface of said metal pedestal beneath said insulation member, and said conductive plug members are symmetrically spaced in said insulation member around said wafer.

19. The improved plasma etching apparatus of claim 15 wherein a top surface of each of said plurality of conductive plug means is completely surrounded by said insulation surfaces.

20. The improved plasma etching apparatus of claim 15 wherein said plurality of conductive plug means are circular in cross-section.

21. The improved plasma etching apparatus of claim 15 wherein the total area of said plurality of conductive plug means is at least about 1 cm$^2$.

22. The apparatus of claim 15 wherein said plug members are constructed of a conductive material selected from the group consisting of carbon; a silicide; titanium nitride; a carbide; and a semiconductor.

23. An improved plasma etching apparatus for the plasma etching of semiconductor wafers wherein the improvement comprises a plurality of conductive silicon plug means each having an end portion located in one or more protective insulator members which are located on members at rf potential within said apparatus to inhibit arcing from electrical charges accumulating on said insulator members, said silicon plug means extending through said one or more protective insulator members to said members at rf potential, said silicon plug means being doped with a sufficient amount of one or more dopants selected from the group consisting of boron, phosphorus, antimony, and arsenic to provide a resistivity of not greater than about 20 ohm-cm.

24. An improved plasma etching apparatus for the plasma etching of semiconductor wafers having a metal pedestal at rf potential within said apparatus which supports said wafer, wherein the improvement comprises a first ring of protective insulation material covering a portion of an exposed top surface of said metal pedestal immediately surrounding said wafer thereon; a conductive silicon ring on another portion of said exposed top surface of said metal pedestal, and surrounding said first ring of insulation; and a second ring of protective insulation material on another portion of said exposed top surface of said metal pedestal surrounding said conductive silicon ring; said silicon ring acting to inhibit arcing by electrical charges accumulating on said first and second rings of insulation material adjacent said wafer, said silicon ring being doped with a sufficient amount of one or more dopants selected from the class consisting of boron, phosphorus, antimony, and arsenic to provide a resistivity of not greater than about 20 ohm-cm.

25. An improved plasma etching apparatus for the plasma etching of semiconductor wafers to inhibit arcing from electrical charge buildup on one or more protective surfaces on members at rf potential within said apparatus comprising:
 a) a metal pedestal having a top surface on which said wafer to be etched is supported;
 b) first insulation material located on a portion of said top surface of said metal pedestal;
 c) a clamping ring mechanism, comprising a metal clamping ring with one or more metal surfaces thereon, which urges said wafer against said metal pedestal, said one or more metal surfaces on said clamping ring covered with second insulation material to protect said clamping ring mechanism from attack from said plasma; and
 d) one or more conductive plug members comprising a conductive material selected from the group consisting of carbon, a silicide, titanium nitride, a carbide, and a semiconductor:
  i) one or more of said conductive plug members extending from a top surface of said first insulation material located on a portion of said top surface of said metal pedestal through said first insulation material to said top surface of said metal pedestal; and
  ii) one or more of said conductive plug members extending from a surface of said second insulation material on said clamping ring through said second insulation material to said one or more metal surfaces of said clamping ring;
whereby arcing from electrical charge buildup on said first and second insulation material within said apparatus is inhibited.

26. An improved plasma etching apparatus for the plasma etching of semiconductor wafers to inhibit arcing from electrical charge buildup on one or more protective insulator surfaces on members at rf potential within said apparatus comprising:
 a) a metal pedestal having a top surface on which said wafer to be etched is supported;
 b) insulation material located on a portion of said top surface of said metal pedestal immediately surrounding and adjacent said wafer;
 c) electrical resistance means having an electrical resistivity of less than about 100 ohm-cm located on a portion of said top surface of said metal pedestal spaced from said wafer and surrounding said insulation material;
whereby arcing from electrical charge buildup on said surface of said insulation material within said apparatus is inhibited.

27. An improved plasma etching apparatus for the plasma etching of semiconductor wafers wherein said apparatus includes a metal pedestal and a clamping ring mechanism at rf potential within said apparatus, said clamping ring mechanism including a metal clamping ring which urges said wafer against said metal pedestal and one or more surfaces on said clamping ring mechanism covered with insulation material to protect said clamping ring mechanism from attack by said plasma etching, wherein said improvement comprises one or more plugs constructed of conductive material which extend from the surface of said insulation material to at least the metal surface of said clamping ring for inhibiting arcing from electrical charge buildup on said insulation material on said clamping ring.

28. An improved plasma etching apparatus for the plasma etching of semiconductor wafers wherein the improvement comprises a plurality of conductive silicon plug means each having an end portion located in one or more protective insulator members which are located on members at rf potential within said apparatus to inhibit arcing from electrical charges accumulating on said insulator members, said conductive silicon plug means extending through said one or more protective insulator members to said members at rf potential, said conductive silicon plug means having a resistivity of less than about 100 ohm-cm.

29. The improved plasma etching apparatus of claim 28 wherein said conductive silicon plug means are doped with one or more dopants selected from the group consisting of boron, phosphorus, antimony, and arsenic.

30. The improved plasma etching apparatus of claim 29 wherein said conductive silicon plug means are doped with a sufficient amount of said one or more dopants to provide a resistivity of from about 0.001 to about 20 ohm-cm.

31. An improved plasma etching apparatus for the plasma etching of semiconductor wafers having a metal pedestal at rf potential within said apparatus which supports said wafer, wherein the improvement comprises a first ring of protective insulation material covering a portion of an exposed top surface of said metal pedestal immediately surrounding said wafer thereon; a conductive silicon ring on another portion of said exposed top surface of said metal pedestal, and surrounding said first ring of insulation; and a second ring of protective insulation material on another portion of said exposed top surface of said metal pedestal surrounding said conductive silicon ring; said conductive silicon ring acting to inhibit arcing by electrical charges accumulating on said first and second rings of insulation material adjacent said wafer, said conductive silicon ring having a resistivity of less than about 100 ohm-cm.

32. The improved plasma etching apparatus of claim 31 wherein said conductive silicon ring is doped with one or more dopants selected from the group consisting of boron, phosphorus, antimony, and arsenic.

33. The improved plasma etching apparatus of claim 32 wherein said conductive silicon ring is doped with a sufficient amount of said one or more dopants to provide a resistivity of from about 0.001 to about 20 ohm-cm.

* * * * *